(12) United States Patent
Tsui et al.

(10) Patent No.: US 6,452,205 B2
(45) Date of Patent: Sep. 17, 2002

(54) SPARSE-CARRIER DEVICES AND METHOD OF FABRICATION

(75) Inventors: Raymond K. Tsui, Phoenix, AZ (US); Kumar Shiralagi, Chandler, AZ (US); Herbert Goronkin, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/819,438

(22) Filed: Mar. 29, 2001

Related U.S. Application Data

(63) Continuation of application No. 09/340,923, filed on Jun. 28, 1999, now abandoned.

(51) Int. Cl.⁷ .................................................. H01L 29/06
(52) U.S. Cl. ......................................................... 257/14
(58) Field of Search ............................................ 257/14

(56) References Cited

U.S. PATENT DOCUMENTS 5,614,435 A * 3/1997 Petroff et al. ............... 437/110
5,730,798 A * 3/1998 Shiralagi ....................... 117/97

* cited by examiner

Primary Examiner—Olik Chaudhuri
Assistant Examiner—Douglas A. Wille
(74) Attorney, Agent, or Firm—William E. Koch

(57) ABSTRACT

A sparse-carrier device including a crystal structure (10) formed of a first material and having a crystallographic facet (26) with a width (w) and a length and quantum dots (30) formed of a second material and positioned in at least one row on the crystallographic facet (26). The at least one row of quantum dots (30) extends along the length of the crystallographic facet (26) and is at least one quantum dot (30) wide (w) and a plurality of quantum dots long. The number of quantum dot rows determined by the width (w) of the crystallographic facet (26). The row of quantum dots (30) form a building block for circuits based on sparse or single electron devices.

15 Claims, 3 Drawing Sheets

SPARSE-CARRIER DEVICES AND METHOD OF FABRICATION

The present application is continuation and is based on prior U.S. application Ser. No. 09/340,923, filed on Jun. 28, 1999, now abandoned which is hereby incorporated by reference, and priority thereto for common subject matter is hereby claimed.

FIELD OF INVENTION

The present invention pertains to devices that operate through the conduction of a very small number of electrical carriers and to methods of fabricating the devices.

BACKGROUND OF THE INVENTION

A relatively recent development in material science has been the ability to fabricate structures that are small on a quantum scale. On this small scale, 200 Å or less, the applicable physics is no longer that of the solid state bulk nor that of the gaseous free atom, but rather that of a quantum confined intermediate. Early in the development these small scale structures were formed in layers with confinement in one dimension only. The confined structures are typically composed of thin layers produced by MBE equipment on GaAs or other active substrates.

As an example of a use of these thin layers, lasers have been made that utilize the quantum confinement layers for carrier confinement or refractive optical confinement. In quantum-mechanically confined nanostructures, the degree of freedom in the free-electron motion decreases as N, the number of confined dimensions, goes up. This change in the electronic density of states has long been predicted to increase efficiency and reduce temperature sensitivity in lasers, and has been demonstrated for N=1 and N=2. The techniques for the production of very thin layers of material with reasonable electronic mobilities require very meticulous crystal growth and exceedingly high purity.

For the ultimate case of N=3, there is also the occurrence of Coulomb blockade, a phenomenon that provides the basis for the operation of single-electron devices. Generally, a 3-D confined nanostructure is a small particle of material, e.g., semiconductor material, that is small enough to be quantum confined in three dimensions. That is, the quantum contained particle has a diameter that is only about 200 Å or less. This creates a three dimensional well with quantum confinement in all directions.

Traditionally, attempts to fabricate 3-D confined nanostructures relied on e-beam lithography. More recently, STM/AFM and self-assembled quantum dots (3-D confined nanostructures) have been fabricated. However, incorporating the 3-D confined nanostructures into a useful device is very difficult and has not been accomplished in a manufacturable process.

Accordingly, it would be very beneficial to be able to efficiently manufacture 3-D confined nanostructures in a useful device.

It is a purpose of the present invention to provide 3-D confined nanostructures in a useful device.

It is another purpose of the present invention to provide a new and efficient method of manufacturing 3-D confined nanostructures.

SUMMARY OF THE INVENTION

The above problems and others are at least partially solved and the above purposes and others are realized in a sparse-carrier device including a supporting layer having a surface, a crystal structure epitaxially grown on the surface of the supporting substrate, the crystal structure formed of a first material and having a crystallographic facet with a width and a length substantially parallel with the supporting layer and quantum dots formed of a second material and positioned substantially in at least one row on the crystallographic facet. The row of quantum dots extends along the length of the crystallographic facet and is at least one quantum dot wide and a plurality of quantum dot long, the number of rows of quantum dots being determined by the width of the crystallographic facet. A row of quantum dots forms a building block for circuits based on sparse or single electron devices. Generally, electrical connections may be provided to the row of quantum dots for the passage of electrical carriers or the propagation of changes in polarization states therealong, depending upon the operation.

BRIEF DESCRIPTION OF THE DRAWINGS

Referring to the drawings.

DESCRIPTION OF THE PREFERRED EMBODIMENT

Figure 1:
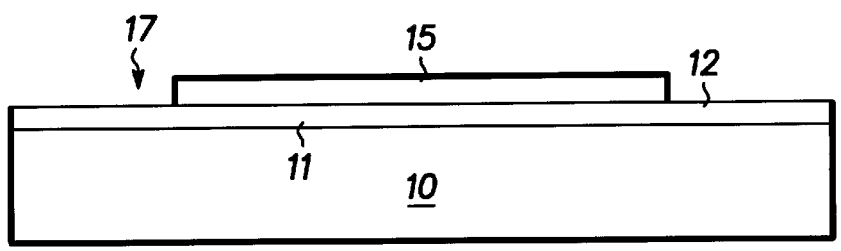
FIGS. 1 through 4 are greatly enlarged, simplified sectional views illustrating a preferred method of patterning a substrate for further processing.

Turning now to the drawings, FIGS. 1–4 illustrate several steps in a preferred method of masking supporting layer, more specifically a gallium arsenide substrate, 10 for the fabrication of sparse-carrier devices. While the present masking method is utilized because of its convenience (the substrate does not have to be removed from the growth chamber throughout the operation), other masking methods known in the semiconductor art may be utilized, if desired. It should be understood that gallium arsenide substrate 10 is utilized herein for purposes of this description but other III–V compounds and other semiconductor materials may be utilized in other applications. Referring specifically to FIG. 1, a simplified sectional view of gallium arsenide substrate 10 having a surface 11 is illustrated. It should be understood that substrate 10 might simply be a supporting structure, such as a wafer of the like, or it might include various layers (not shown) formed on or in the supporting structure.

Surface 11 of gallium arsenide substrate 10 has a film 12 (generally 20 angstroms or less) of a native oxide which, as is well know in the art, forms substantially instantaneously upon exposure to air. The native oxide is not necessary to the present invention and is only illustrated because it is generally present and requires special procedures to prevent. In some applications various types of passivation may be used, to prevent the formation of film 12, in which case such passivation may have to be removed before the present procedure can be performed. It has been found that the present technique will operate generally as described with the surface simply being clean (i.e. no foreign matter).

A mask 15 is positioned adjacent to surface 11 of substrate 10 for patterning surface 11, as will be explained presently. Mask 15 generally is a shadow or metal mask but, in some special applications, it can be formed in the well known manner with photolithography as in an aligner or stepper (generally includes a projected image from a mask). As will become apparent presently, one of the major advantages of the present technique is that photolithography and the like are not necessary for the described masking operations. In a preferred embodiment, mask 15 is a mask plate with metal lines and other features, for example, a chrome mask. In any case, mask 15 is positioned adjacent surface 11 so as to define one or more growth areas 16 on surface 11 beneath mask 15 and one or more unmasked portions 17 on surface 11 of substrate 10.

Figure 2:
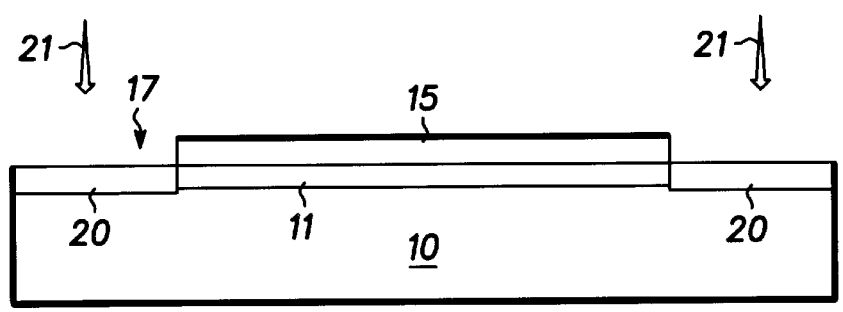

Unmasked portions 17 of surface 11 are exposed to a bright light preferably including deep ultraviolet, represented by arrows 21 in FIG. 2. The bright light may be, for example, the type typically used in aligners, steppers, or E-beam devices in the semiconductor industry. The term "deep ultraviolet" refers to light in the ultraviolet range, generally with a wavelength in the range of 180 to 250 nanometers. It is believed that exposure to other wavelengths, such as 248 nm in a specific example, modifies the composition of the surface oxide by forming a different kind of oxide or complex oxide molecules that are more stable than the native oxide. The exposure to light can be performed under a lamp. However, when the light is collimated, as in an aligner or stepper, sharp features can be defined in unmasked portion 17 or in masked portion 16 by mask 15. In this specific example, gallium arsenide wafer 10 with layer 12 of native oxide on the surface was provided. Standard bright lights, both at 185 nm and at 248 nm, were used with the wafer being exposed through a chrome coated mask for 5 minutes. Oxide film 20 with a thickness less than approximately 2 nm was produced in the unmasked areas.

Figure 3:
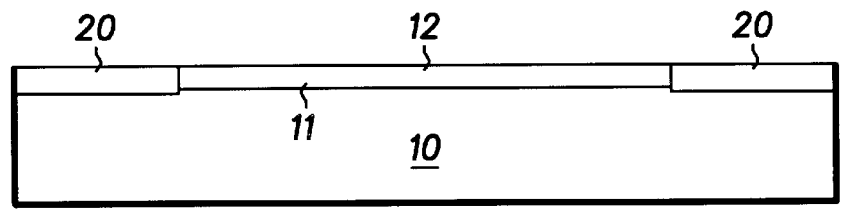
Figure 4:
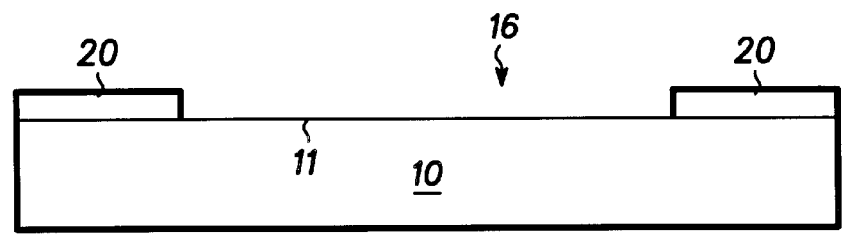

Once oxide film 20 is grown, mask 15 is removed to expose growth area 16, as illustrated in FIG. 3. Oxide film 20 then serves as a mask for further process operations, such as growth, etching, and so on, and can be easily removed in situ by heating, if necessary. As an example of further operations, substrate 10 is then introduced into a growth chamber (not shown) and heated to a temperature of approximately 580° C. to desorb any native oxide that may still be present in growth area 16. Substrate 10 with native oxide-free growth area 16 is illustrated in FIG. 4.

Figure 5:
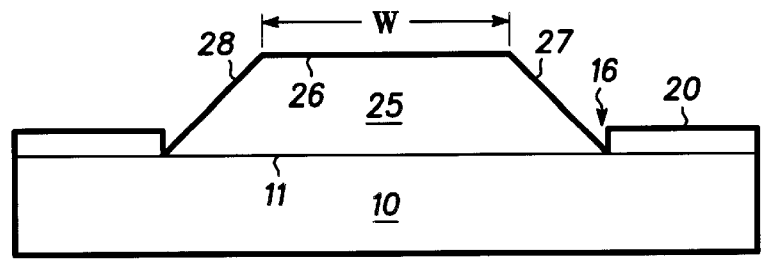
FIG. 5 is a greatly enlarged, simplified sectional view illustrating crystalline material selectively grown on the patterned substrate of FIG. 4 in accordance with the present invention.

While retaining substrate 10 in the growth chamber, selective growth of crystalline, or semiconductor, material 25 in growth area 16 is performed, as illustrated in FIG. 5. With oxide film 20 in place as a mask for further growth, a predetermined amount of crystalline material 25 is selectively grown in area (or areas) 16. For purposes of this disclosure, "selective growth" or "selectively grown" is defined as growing only in the specific or designated area. In this specific example, GaAs is grown using selective area epitaxy (SAE) and well defined crystallographic facets develop while no growth occurs on oxide film 20. Further, since material 25 grows in a crystalline form, growth rates and shapes are crystallographic dependent, i.e. the rate and shape of growth are dependent upon the type of material 25 being utilized.

In the specific example illustrated in FIG. 5, opening 16 is approximately 1 micron wide and may extend lengthwise (into and out-of the figure) as far as desired. GaAs is grown on exposed surface 11 of substrate 10 by chemical beam epitaxy using tri-isopropylgallium and arsine as the source materials. In this specific example, tri-isopropylgallium is used because it allows for lower growth temperatures that are more compatible with the resistless oxide film 20. Other possible processes include using triethylgallium and arsine at a substrate temperature of approximately 620° C.

By carefully controlling the amount of growth the crystalline structure illustrated in FIG. 5 is grown with an upper facet 26 having a width 'w' of approximately 60 nm in this specific embodiment, and preferably less than 200 nm. Two other facets 27 and 28 are also grown but, as will be explained, are not used. The limits on the width 'w' of facet 26 are related to the quantum dot diameter and density. The lower limit for 'w' is equal to a quantum dot diameter. In principle, only one row of quantum dots will be formed on the facet if the width 'w' is less than the average dot-to-dot distance, d, given by $d=1/(\rho)^{1/2}$, where $\rho$ is the areal dot density. For example, $d=100$ nm if $\rho=1\times10^{10}/cm^2$. Both the quantum dot diameter and the density are influenced by the growth conditions. It should be noted that too much material 25 (i.e. crystalline growth) results in a peak (no upper facet 26) and too little material 25 results in too wide a facet 26. Further, in this specific embodiment, the crystalline structure is arranged so that upper facet 26 is the (100) facet of the GaAs. It is expected that other facets and/or facets directed other than upwardly, may be used in other applications and the present embodiment is utilized only for purposes of explanation.

Figure 6:
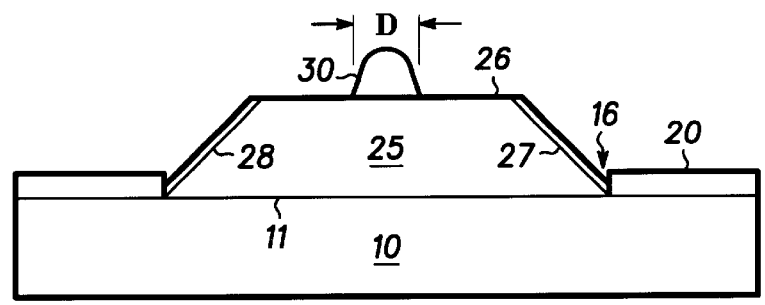
FIG. 6 is a greatly enlarged, simplified sectional view illustrating crystalline material selectively grown on a facet of the crystalline material illustrated in FIG. 5 in accordance with the present invention.

Turning now to FIG. 6, a second crystalline material is selectively grown on facet 26 of crystal material 25. In a specific example, InAs was selectively grown using trimethyl indium and arsine in a chemical beam epitaxy. The growth rates of InAs are different on the various GaAs facets and, utilizing this face, InAs grows only on the (100) facet thick enough for strain-induced islanding to occur and a quantum structure herein referred to as a quantum dot 30 is produced. Quantum dot 30 is a small particle of material, e.g., semiconductor material, that is small enough to be quantum confined in three dimensions. That is, quantum dot 30 has a diameter, D, that is less than about 200 Å. This creates a three dimensional well with quantum confinement in all directions. InAs growth on facets 27 and 28 is either too slow or non-existent so that no strain-induced islanding can occur on these facets. The ability to avoid InAs growth on oxide layer 20 and the amount of InAs that nucleates on other facets (e.g. facets 27 and 28) are strongly dependent on the growth conditions.

In this specific example, the temperature of the substrate was lowered to approximately 525° C. and, using trimethylindium as the source, indium was delivered onto facet 26 together with arsine in a multiple of cycles each lasting 6–10 seconds long. The fluxes on In and As delivered in each cycle were equivalent to that which would provide the growth of a fraction of a monolayer (ML) of InAs on an unpatterned wafer. The flux levels and the total number of cycles thus determine the total amounts delivered to facet 26. During the second half of each cycle, only arsine was delivered to facet 26 to allow the surface to approach equilibrium conditions. Alternatively, measured amounts of indium and arsine can also be delivered continuously. In the example of InAs quantum dots formed on GaAs, the diameter 'D' is typically 30 nm or less with a height of approximately 7–8 nm. Also, the quantum dots are formed with a density of approximately $10^9$–$10^{10}$ quantum dots/cm$^2$. Deposition of additional mismatched material results in coalescence of individual quantum dots and formation of dislocations.

Figure 7:
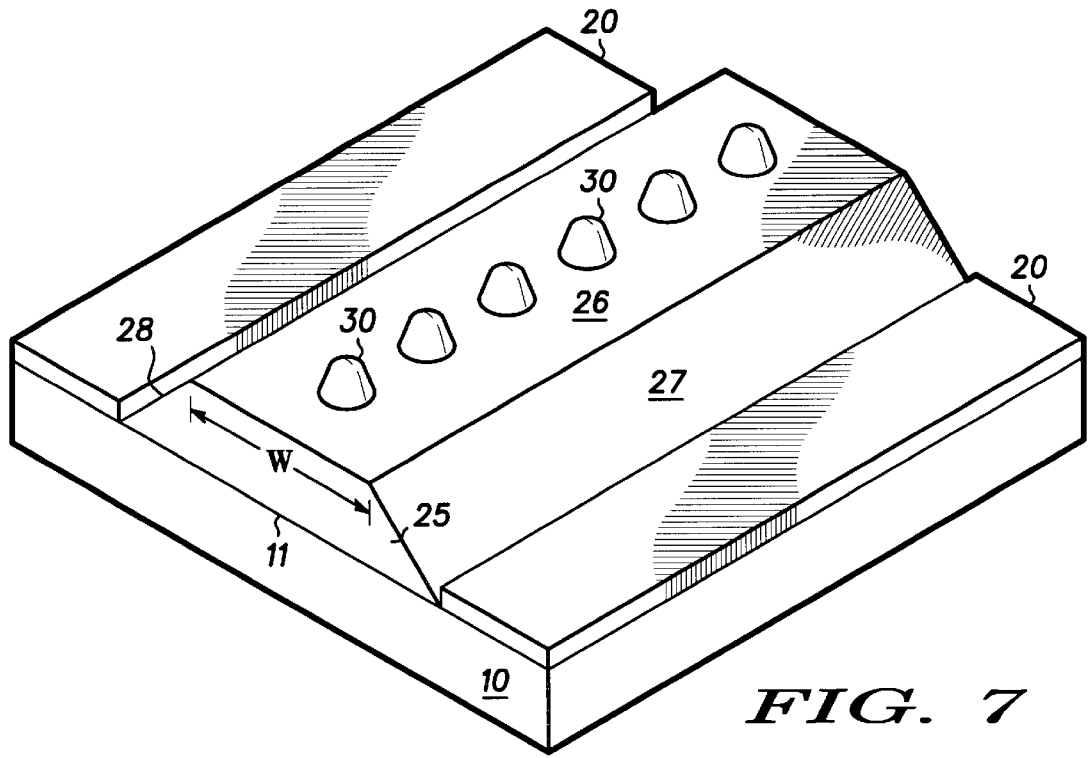
FIG. 7 is a greatly enlarged orthogonal view of a sparse-carrier device in accordance with the present invention.

It should be understood that the formation of the quantum dots on an unlimited surface occurs in a generally random location. However, it has been found that the quantum dot density for given growth conditions is, to a large extent, a function of the facet width. For a given total indium (In) flux (for example) delivered to the surface, the areal density of the quantum dots increases with the facet width. Thus, by adjusting the width 'w' of facet 26 a row of quantum dots 30 approximately one quantum dot wide and a plurality of quantum dots long is produced along the length of facet 26, as illustrated in FIG. 7. It should of course be understood that a row more than one quantum dot wide, or more than one row, may be desired on a facet and, while the present embodiment may be used to fabricate a row of quantum dots approximately one quantum dot wide additional quantum dots may be formed as illustrated in FIG. 8 (discussed presently).

Generally, in the example described and illustrated in FIG. 7, electrons introduced at one end of the single row of quantum dots 30 will migrate or tunnel to the opposite end if the proper potentials are applied. While electrons are the prime carrier in this example, it is expected that structures utilizing holes as the carriers could also be fabricated using the precepts described herein. Also, in some approaches, no carriers travel down the chain, only polarization states change and the effect propagates along the chain. By patterning the oxide (see FIGS. 1–4) to form desired paths and structures, various sparse-carrier devices can be fabricated.

Figure 8:
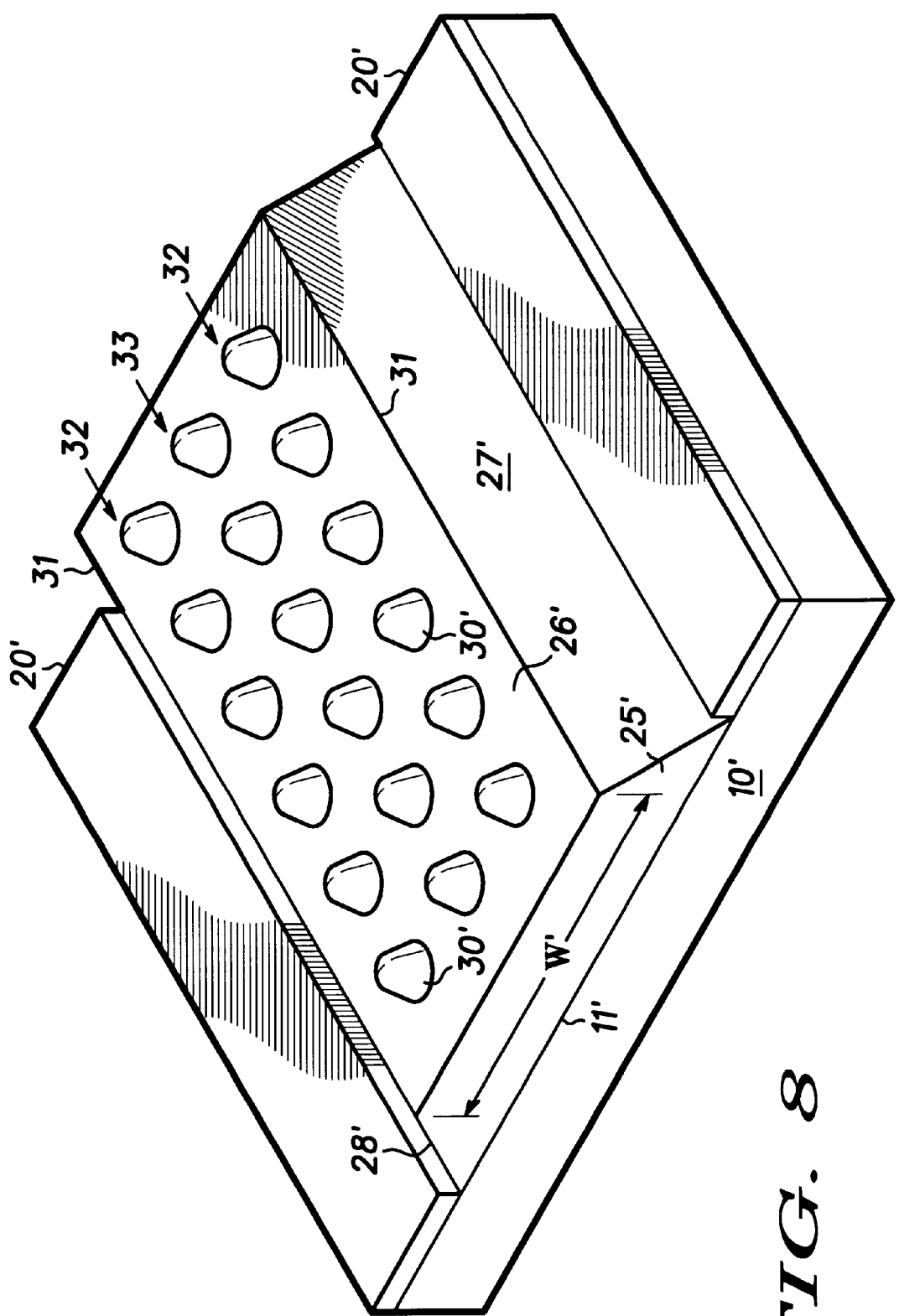
FIG. 8 is a greatly enlarged orthogonal view of an alternative embodiment of a sparse-carrier device in accordance with the present invention.

Referring now to FIG. 8, illustrated in greatly enlarged orthogonal view is an alternative embodiment of a sparse-carrier device in accordance with the present invention. In the embodiment of FIG. 8, portions that are similar to those previously described with regard to FIGS. 1–7 are designated with similar numbers having a prime added to indicate the. different embodiment. As previously described with regard to the first embodiment, by controlling the amount of growth of the crystalline structure illustrated in FIG. 8 allows for the formation of an upper facet 26' having a width 'w'' of approximately 180 nm in this particular embodiment, and preferably less than 200 nm. Two other facets 27' and 28' are also grown but, as previously explained, are not used. The limits on the width 'w'' of facet 26' are related to the quantum dot diameter, number of rows of quantum dots, and density of the individual quantum dots. The quantum dot diameter and the density and the number of rows of quantum dots formed are influenced by the growth conditions. It should be noted that too much material 25' (i.e. crystalline growth) results in a peak (no upper facet 26') and too little material 25' results in too wide a facet 26'. Further, in this specific embodiment, the crystalline structure is arranged so that upper facet 26' is the (100) facet of the GaAs. It is expected that other facets and/or facets directed other than upwardly, may be used in other applications and the present embodiment is utilized only for purposes of explanation.

As previously described, a second crystalline material is selectively grown on facet 26' of crystal material 25'. In this specific example, InAs is selectively grown using trimethyl indium and arsine in a chemical beam epitaxy. The growth rates of InAs are different on the various GaAs facets and, utilizing this fact, InAs grows only on the (100) facet thick enough for strain-induced islanding to occur and a quantum structure herein referred to as quantum dots 30' is produced. As previously defined, each quantum dot 30' is a small particle of material, e.g., semiconductor material, that is small enough to be quantum confined in three dimensions. That is, each quantum dot 30' has a diameter, D, that is less than about 200 Å. This creates a three dimensional well with quantum confinement in all directions.

The width, 'w'' of facet 26' determines the number of rows of dots 30' that can be obtained on that facet. The formation of InAs dots 30' on the top facet 26' is a function of a number of parameters such as width 'w'' of the top facet 26', the width of the side facets 27' and 28' (determines the amount of indium available for migration to top), and the indium migration length. These factors are dependent upon growth temperature, V/III ratio and the absolute growth rate.

When 'w'' of top facet 26' decreases below 200 nm, the spatial distribution of dots 30' becomes more regular. Randomness is high when the growth temperature is low and the flux ratio is high.

When the indium migration lengths are increased by increasing the temperature and decreasing the V/III ratio, a regularity in the arrangement of dots 30' results and it begins to form rows 32 along top facet 26'. While the change in growth conditions affects the size of dots 30', the 'w'' of top facet 26' directly determines the number of rows 32 possible. Thus, by controlling the growth conditions and by controlling 'w'' of top facet width 26' (which is a function of the thickness of the epitaxial GaAs grown for a given oxide opening), the rows of InAs dots 30' on the top facet 26' and their size can be controlled. Generally, the highest concentration of In is found on the edge and thus the first rows of quantum dots 30' to form are located at edge 31. If space allows, this formation of quantum dots 30' about edge 31 results in a constraint of the remaining area of top facet 26' and thus the formation of additional rows 32 of quantum dots 30'.

In addition, with the migration of indium from the sidewalls up to top facet 26', the indium density tends to be highest at the facet edges 31. Thus dots 30' will first form at the facet edges 31. If 'w'' is wide enough, two aligned rows 32 of dots 30' will form at the two edges 31. If the top facet 26' is formed with a width, 'w'' large enough for three rows (as illustrated), a middle row 33 of dots 30' will appear between the two edge rows 32. In that the width 'w'' of epitaxially grown facet 26' is not limited, the number of rows of quantum dots 30' is accordingly not limited. Only a single material is required for fabrication of the quantum dots 30', thus ease in fabrication is achieved as compared to those devices which utilize multiple layers with different compositions. In that etching is not used to fabricate top facet 26', alignment of one or more rows of quantum dots 30' within a couple of tens of manometers is achieved.

Generally, and as previously described and illustrated with respect to FIG. 7, electrons introduced at one end of each row of quantum dots 30' will migrate or tunnel to the opposite end if the proper potentials are applied. It should be understood that various electronic properties may be experienced as a result of the proximity of the rows. While electrons are the prime carrier in this example, it is expected that structures utilizing holes as the carriers could also be fabricated using the precepts described herein. Also, in some approaches, no carriers travel down the chain, only polarization states change and the effect propagates along the chain. By patterning the oxide (see FIGS. 1–4) to form desired paths and structures, various sparse-carrier devices can be fabricated.

Thus, an efficient method of manufacturing sparse-carrier devices and a great variety of sparse electron devices have been disclosed. Further, while specific examples are utilized herein for purposes of explanation, those skilled in the art will understand that many varieties of materials and forms may be utilized.

While we have shown and described specific embodiment of the present invention, further modification and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A sparse-carrier device comprising:

a substrate having a surface;

a crystallographic structure formed of a homogeneous material epitaxially grown directly adjacent the surface of the substrate, the crystallographic structure defining an upper crystallographic facet having a width and a length substantially parallel with the substrate; and a plurality of indium based quantum dots positioned in at least one row on the upper crystallographic facet of the crystallographic structure, the at least one row extending along the length of the upper crystallographic facet and being at least one quantum dot wide and a plurality of quantum dots long, the number of aligned rows of quantum dots determined by the width of the upper crystallographic facet.

2. A sparse-carrier device as claimed in claim 1 wherein the width of the crystallographic facet is defined to restrict formation of the second material thereon to a one quantum dot wide row of quantum dots.

3. A sparse-carrier device as claimed in claim 2 wherein the width of the crystallographic facet is less than approximately 200 nm.

4. A sparse-carrier device as claimed in claim 3 wherein the width of the crystallographic facet is less than approximately 200 nm.

5. A sparse-carrier device as claimed in claim 1 wherein the first material includes gallium arsenide.

6. A sparse-carrier device as claimed in claim 5 wherein the second material includes indium arsenide.

7. A sparse-carrier device as claimed in claim 6 wherein the crystallographic facet of the first material is a (100) facet.

8. A sparse-carrier device as claimed in claim 1 wherein the quantum dots have a diameter of approximately 25 nm.

9. A sparse-carrier device as claimed in claim 1 including in addition a portion of the supporting layer covered by a deep ultraviolet oxide film positioned to define the size and shape of the crystallographic facet.

10. A sparse-carrier device comprising:

a substrate having a surface;

a homogeneous crystallographic structure formed of gallium arsenide selectively grown directly adjacent the surface of the substrate, the crystallographic structure defining an upper crystallographic facet having a width and a length substantially parallel with the substrate;

a plurality of indium based quantum dots positioned in at least one aligned row on the upper crystallographic facet, the at least one row extending along the length of the upper crystallographic facet and being at least one quantum dot wide and a plurality of quantum dots long, the number of rows of quantum dots determined by the width of the upper crystallographic facet;

the crystallographic structure being selected so that the quantum dots selectively form only on the upper crystallographic facet; and the upper crystallographic facet being defined with a width to restrict formation of the indium based quantum dots thereon to the at least one quantum dot wide row of quantum dots.

11. A sparse-carrier device as claimed in claim 10 wherein the width of the crystallographic facet is less than approximately 1.5 $\mu$m.

12. A sparse-carrier device as claimed in claim 11 wherein the width of the crystallographic facet is less than approximately 200 nm.

13. A sparse-carrier device as claimed in claim 10 wherein the crystallographic facet is a (100) facet.

14. A sparse-carrier device as claimed in claim 10 wherein the quantum dots have a diameter of approximately 25 nm.

15. A sparse-carrier device as claimed in claim 10 including in addition a portion of the surface of the supporting layer covered by a deep ultraviolet oxide film positioned to define the size and shape of the crystallographic facet.

* * * * *